(12) United States Patent
Hanaoka

(10) Patent No.: US 7,294,933 B2
(45) Date of Patent: Nov. 13, 2007

(54) SEMICONDUCTOR WAFER, SEMICONDUCTOR DEVICE AND METHOD OF MANUFACTURING THE SAME, CIRCUIT BOARD, AND ELECTRONIC EQUIPMENT

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/649,871

(22) Filed: Jan. 5, 2007

(65) Prior Publication Data

US 2007/0120251 A1    May 31, 2007

Related U.S. Application Data

(62) Division of application No. 10/679,467, filed on Oct. 7, 2003, now Pat. No. 7,176,572.

(30) Foreign Application Priority Data

Oct. 15, 2002   (JP) .............................. 2002-300261
Jul. 8, 2003    (JP) .............................. 2003-271768

(51) Int. Cl.
   *H01L 23/48*   (2006.01)
   *H01L 23/52*   (2006.01)
   *H01L 29/40*   (2006.01)
(52) U.S. Cl. ................ 257/758; 257/723; 257/759; 257/790; 257/791; 438/110; 438/113; 438/114; 361/764; 361/765

(58) Field of Classification Search ................ 257/723, 257/781, 758–759, 760, 786–788, 790–791; 438/110–114, 107, 118, 460, 465; 361/803, 361/764–765, 777
See application file for complete search history.

(56) References Cited

U.S. PATENT DOCUMENTS 5,773,359 A * 6/1998 Mitchell et al. ............ 438/614

(Continued)

FOREIGN PATENT DOCUMENTS

JP         A-11-87558         3/1999

(Continued)

OTHER PUBLICATIONS

U.S. Appl. No. 09/700,464, filed Mar. 8, 2000, Hanaoka et al.

(Continued)

*Primary Examiner*—Mary Wilczewski
*Assistant Examiner*—Thanh Y. Tran
(74) *Attorney, Agent, or Firm*—Oliff & Berridge, PLC

(57) ABSTRACT

A semiconductor wafer includes a redistribution layer which is electrically connected with a pad which is an end portion of an interconnect, a first resin layer which is formed over the redistribution layer, a second resin layer which is formed over the first resin layer and covers the side surface of the first resin layer, and an external terminal which is formed to be electrically connected with the redistribution layer in a manner to avoid the pad.

14 Claims, 7 Drawing Sheets

U.S. PATENT DOCUMENTS

| | | | |
|---|---|---|---|
| 5,821,626 A | 10/1998 | Ouchi et al. | |
| 6,097,087 A * | 8/2000 | Farnworth et al. | 257/698 |
| 6,232,666 B1 * | 5/2001 | Corisis et al. | 257/774 |
| 6,235,552 B1 | 5/2001 | Kwon et al. | |
| 6,242,156 B1 | 6/2001 | Teng | |
| 6,323,542 B1 | 11/2001 | Hashimoto | |
| 6,376,279 B1 | 4/2002 | Kwon et al. | |
| 6,425,516 B1 | 7/2002 | Iwatsu et al. | |
| 6,534,386 B2 | 3/2003 | Irie | |
| 6,555,921 B2 | 4/2003 | Kwon et al. | |
| 6,607,938 B2 | 8/2003 | Kwon et al. | |
| 6,730,589 B2 | 5/2004 | Hashimoto | |
| 6,891,248 B2 | 5/2005 | Akram et al. | |
| 6,906,928 B2 | 6/2005 | Hauser et al. | |
| 2002/0063332 A1 | 5/2002 | Yamaguchi et al. | |

FOREIGN PATENT DOCUMENTS

| | | |
|---|---|---|
| JP | A-11-297873 | 10/1999 |
| JP | A-2000-311921 | 11/2000 |
| JP | A-2000-340588 | 12/2000 |
| JP | A-2001-284376 | 10/2001 |

OTHER PUBLICATIONS

U.S. Appl. No. 10/654,449, filed Sep. 4, 2003, Hanaoka.
U.S. Appl. No. 10/667,331, filed Sep. 23, 2003, Hanaoka.

* cited by examiner

SEMICONDUCTOR WAFER, SEMICONDUCTOR DEVICE AND METHOD OF MANUFACTURING THE SAME, CIRCUIT BOARD, AND ELECTRONIC EQUIPMENT

This is a Division of application Ser. No. 10/679,467 filed Oct. 7, 2003 now U.S. Pat. No. 7,176,572. The disclosure of the prior application is hereby incorporated by reference herein in its entirety.

Japanese Patent Application No. 2002-300261 filed on Oct. 15, 2002 and Japanese Patent Application No. 2003-271768 filed on Jul. 8, 2003, are hereby incorporated by reference in their entirety.

BACKGROUND OF THE INVENTION

The present invention relates to a semiconductor wafer, a semiconductor device and a method of manufacturing the same, a circuit board, and electronic equipment.

Bare chip mounting is ideal in order to enable high density mounting of a semiconductor device. However, a guarantee of quality and handling of the bare chip are difficult. Therefore, a semiconductor device to which a chip scale/size package (CSP) is applied has been developed. In particular, a wafer level CSP has attracted attention in recent years. In the wafer level CSP, packaging is performed at the wafer level, and the wafer is cut into individual packages. Therefore, if the wafer is cut in a state in which a plurality of layers are formed on the wafer, the end faces of the layers are exposed. This may cause water to enter between the layers or the layers to be separated, whereby reliability is decreased.

BRIEF SUMMARY OF THE INVENTION

A semiconductor wafer according to one aspect of the present invention comprises:

a semiconductor body which includes an integrated circuit, an interconnect which is electrically connected with the integrated circuit, and a pad which is an end portion of the interconnect and is formed on a surface of the semiconductor body;

a redistribution layer which is formed over the semiconductor body, is electrically connected with the pad, and includes a first portion located over the pad and a second section other than the first portion;

a first resin layer which is formed over the redistribution layer;

a second resin layer which is formed over the first resin layer and covers a side surface of the first resin layer; and an external terminal which is formed over the second section of the redistribution layer and is electrically connected with the redistribution layer.

A semiconductor device according to another aspect of the present invention comprises:

a semiconductor body which includes an integrated circuit, an interconnect which is electrically connected with the integrated circuit, and a pad which is an end portion of the interconnect and is formed on a surface of the semiconductor body;

a redistribution layer which is formed over the semiconductor body, is electrically connected with the pad, and includes a first portion located over the pad and a second section other than the first portion;

a first resin layer which is formed over the redistribution layer;

a second resin layer which is formed over the first resin layer and covers a side surface of the first resin layer; and an external terminal which is formed over the second section of the redistribution layer and is electrically connected with the redistribution layer.

A circuit board according to a further aspect of the present invention has the above semiconductor device mounted thereon.

Electronic equipment according to a still further aspect of the present invention comprises the above semiconductor device.

A method of manufacturing a semiconductor device according to a yet further aspect of the present invention comprises:

forming a redistribution layer over a semiconductor wafer which includes an integrated circuit and an interconnect electrically connected with the integrated circuit, the redistribution layer electrically connecting with a pad which is a part of the interconnect and including a first portion located over the pad and a second section other than the first portion;

forming an external terminal on the second section of the redistribution layer;

forming a first resin layer having a side surface so that at least a part of the first resin layer is placed on the redistribution layer;

forming a second resin layer over the first resin layer so as to cover the side surface of the first resin layer; and cutting the semiconductor wafer.

DETAILED DESCRIPTION OF THE EMBODIMENT

Figure 1:
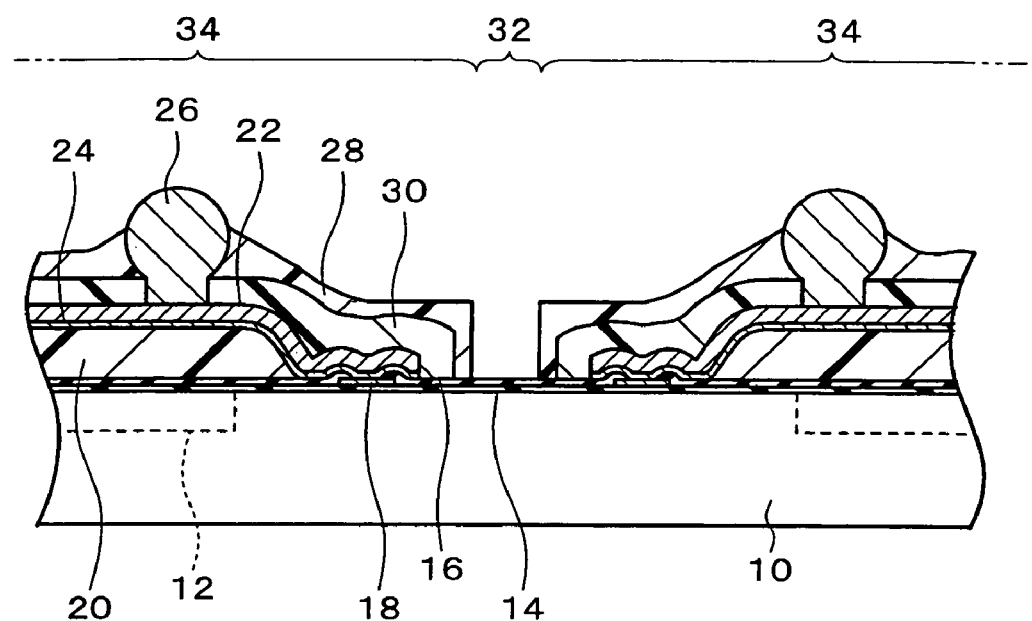
FIG. 1 shows a semiconductor wafer according to a first embodiment of the present invention.

Embodiments of the present invention may prevent a decrease in reliability relating to a semiconductor wafer, a semiconductor device, a method of manufacturing the semiconductor device, a circuit board, and electronic equipment.

(1) A semiconductor wafer according to one embodiment of the present invention comprises:

a semiconductor body which includes an integrated circuit, an interconnect which is electrically connected with the integrated circuit, and a pad which is an end portion of the interconnect and is formed on a surface of the semiconductor body;

a redistribution layer which is formed over the semiconductor body, is electrically connected with the pad, and includes a first portion located over the pad and a second section other than the first portion;

a first resin layer which is formed over the redistribution layer;

a second resin layer which is formed over the first resin layer and covers a side surface of the first resin layer; and an external terminal which is formed over the second section of the redistribution layer and is electrically connected with the redistribution layer.

According to this semiconductor wafer, since the second resin layer covers the side surface of the first resin layer, water does not enter between the first and second resin layers, whereby the first resin layer is rarely separated. Therefore, a decrease in reliability can be prevented.

(2) In this semiconductor wafer, the first resin layer may be formed to cover the redistribution layer excluding a region in which the external terminal is formed, and the second resin layer may be formed to cover at least a lower part of the external terminal.

(3) This semiconductor wafer may further comprise an insulating layer under the redistribution layer.

(4) In this semiconductor wafer, the semiconductor wafer may include a first region and a plurality of second regions, each of the second regions being surrounded by the first region, and the first resin layer and the second resin layer may be formed only in the second region.

(5) In this semiconductor wafer, a part of the second resin layer which covers the side surface of the first resin layer may be formed in a upper part and along an edge portion of the second region.

(6) A semiconductor device according to another embodiment of the present invention comprises:

a semiconductor body which includes an integrated circuit, an interconnect which is electrically connected with the integrated circuit, and a pad which is an end portion of the interconnect and is formed on a surface of the semiconductor body;

a redistribution layer which is formed over the semiconductor body, is electrically connected with the pad, and includes a first portion located over the pad and a second section other than the first portion;

a first resin layer which is formed over the redistribution layer;

a second resin layer which is formed over the first resin layer and covers a side surface of the first resin layer; and an external terminal which is formed over the second section of the redistribution layer and is electrically connected with the redistribution layer.

According to this semiconductor device, since the second resin layer covers the side surface of the first resin layer, water does not enter between the first and second resin layers, whereby the first resin layer is rarely separated. Therefore, a decrease in reliability can be prevented.

(7) In this semiconductor device, the first resin layer may be formed to cover the redistribution layer excluding a region in which the external terminal is formed, and the second resin layer may be formed to cover at least a lower part of the external terminal.

(8) This semiconductor device may further comprise an insulating layer under the redistribution layer.

(9) A circuit board according to a further embodiment of the present invention has the above semiconductor device mounted thereon.

(10) Electronic equipment according to a still further embodiment of the present invention comprises the above semiconductor device.

(11) A method of manufacturing a semiconductor device according to a yet further embodiment of the present invention comprises:

forming a redistribution layer over a semiconductor wafer which includes an integrated circuit and an interconnect electrically connected with the integrated circuit, the redistribution layer electrically connecting with a pad which is a part of the interconnect and including a first portion located over the pad and a second section other than the first portion;

forming an external terminal on the second section of the redistribution layer;

forming a first resin layer having a side surface so that at least a part of the first resin layer is placed on the redistribution layer;

forming a second resin layer over the first resin layer so as to cover the side surface of the first resin layer; and cutting the semiconductor wafer.

According to this method of manufacturing a semiconductor device, since the second resin layer covers the side surface of the first resin layer, water does not enter between the first and second resin layers, whereby the first resin layer is rarely separated. Therefore, a decrease in reliability can be prevented.

(12) This method of manufacturing a semiconductor device may comprise:

forming the first resin layer to cover the redistribution layer excluding a region in which the external terminal is formed, and forming the second resin layer to cover at least a lower part of the external terminal.

(13) This method of manufacturing a semiconductor device may further comprise forming an insulating layer before forming the redistribution layer, and the redistribution layer may be formed on the insulating layer.

(14) In this method of manufacturing a semiconductor device, the semiconductor wafer may include a first region and a plurality of second regions, each of the second regions being surrounded by the first region, the first resin layer and the second resin layer may be formed only in the second region, and the semiconductor wafer may be cut along the first region.

(15) This method of manufacturing a semiconductor device may comprise forming a part of the second resin layer which covers the side surface of the first resin layer, in a upper part and along an edge portion of the second region.

(16) In this method of manufacturing a semiconductor device, the second resin layer may be formed by using a resin that is sensitive to radiation and by applying lithographic technology.

(17) In this method of manufacturing a semiconductor device, the second resin layer may be formed by ejecting a resin by using an ink-jet method.

(18) In this method of manufacturing a semiconductor device, the second resin layer may be formed by applying a resin by using a printing method.

The embodiments of the present invention are described below with reference to the drawings. However, the present invention is not limited to the following embodiments.

First Embodiment

Figure 2:
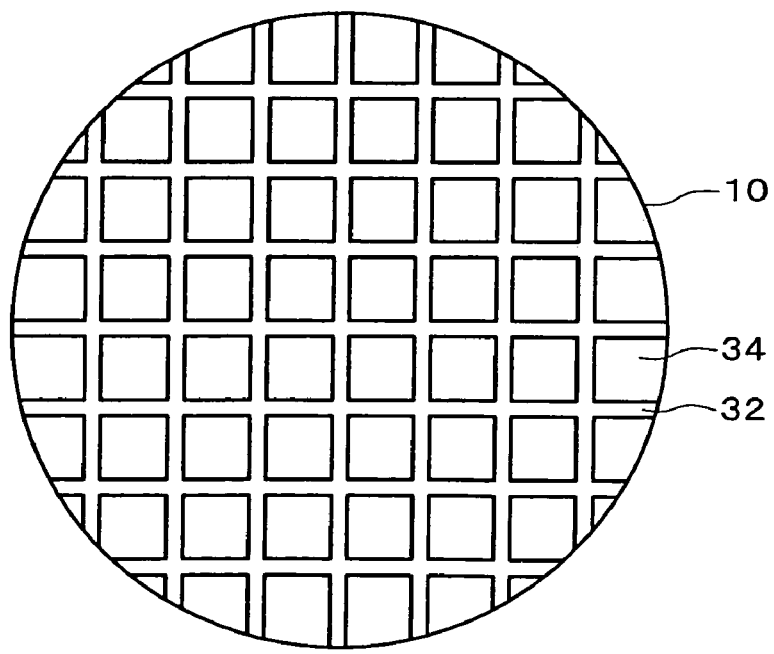
FIG. 2 shows a semiconductor wafer according to the first embodiment of the present invention.

FIG. 1 is a cross-sectional view showing a semiconductor wafer according to a first embodiment of the present invention. FIG. 2 is a plan view showing the semiconductor wafer. An integrated circuit 12 is formed in a semiconductor body of the semiconductor wafer 10. In the case of cutting the semiconductor wafer 10 into a plurality of semiconductor chips, a plurality of the integrated circuits 12 are formed in the semiconductor wafer 10, and each of the semiconductor chips includes the integrated circuit 12.

One or more passivation films 14 and 16 may be formed on the surface of the semiconductor wafer 10. The passivation film 16 may be formed of a polyimide resin or the like on the passivation film 14 formed of $SiO_2$, SiN, or the like, for example.

A pad 18 is formed on the semiconductor wafer 10. The pad 18 is a part (end portion) of an interconnect which is electrically connected with the integrated circuit (semiconductor integrated circuit, for example) 12. The passivation film 16 is formed to avoid at least the center of the pad 18.

An insulating layer 20 may be formed on the passivation films 14 and 16 on the semiconductor wafer 10. The insulating layer 20 may be formed of a plurality of layers or a single layer. The insulating layer 20 may have a stress relief function. The insulating layer 20 may be formed of a resin such as a polyimide resin, silicone-modified polyimide resin, epoxy resin, silicone-modified epoxy resin, benzocyclobutene (BCB), or polybenzoxazole (PBO). The insulating layer 20 may be formed to avoid a first region (cutting region) 32.

A redistribution layer 22 is formed on the semiconductor wafer 10. The redistribution layer 22 includes a first portion located on the pad 18, and a second section (section present on the insulating layer 20) other than the first portion. The redistribution layer 22 may be formed on a conductive film 24. An external terminal 26 may be formed on the redistribution layer 22. The external terminal 26 may be formed of a filler metal (soft solder or hard solder). For example, the external terminal 26 may be a solder ball.

In the present embodiment, at least two resin layers (including first and second resin layers 30 and 28) are formed. The first and second resin layers 30 and 28 are formed in the second region 34 so as to avoid the first region 32 of the semiconductor wafer 10 so that at least a part of the first and second resin layers 30 and 28 is placed on the redistribution layer 22. The first region 32 is a cutting (dicing, for example) region of the semiconductor wafer 10. The second region 34 is a region other than the first region 32 (region which becomes a semiconductor chip, for example). The first region 32 may form a region in the shape of a lattice, as shown in FIG. 2. The second region 34 is surrounded by the first region 32.

The first resin layer 30 may be a solder resist layer, for example. The first resin layer 30 may be formed to cover the redistribution layer 22 excluding the region in which the external terminal 26 is formed (at least a part of a land, for example). The first resin layer 30 may cover the side surface and the end surface (rise surface) of the redistribution layer 22. The first resin layer 30 is formed to avoid the first region 32. The first resin layer 30 may be formed at an interval from the first region 32.

The second resin layer 28 covers the first resin layer 30. The second resin layer 28 is formed to cover the side surface (rise surface) of the first resin layer 30. This prevents the first resin layer 30 from being exposed, whereby the interface between the first and second resin layers 30 and 28 is not exposed. The area of the second resin layer 28 which covers the side surface of the first resin layer 30 is formed on the edge of the outer circumference of the second region 34. The second resin layer 28 is formed to avoid the first region 32. The second resin layer 28 may be formed at an interval from the first region 32. The area of the second resin layer 28 which covers the side surface of the first resin layer 30 may be formed to be adjacent to the first region 32. Specifically, the first region 32 may be partitioned by the rise surface of the second resin layer 28.

The second resin layer 28 is formed to surround at least the lower part of the external terminal 26. This enables thermal stress applied to the external terminal 26 to be reduced. The second resin layer 28 may be formed of a polyimide resin or the like. The coefficient of (linear) thermal expansion of the second resin layer 28 may be greater than that of the insulating layer 20.

According to the present embodiment, since the second resin layer 28 covers the side surface of the first resin layer 30, water does not enter between the first and second resin layers 30 and 28, whereby the first resin layer 30 is rarely separated. Therefore, a decrease in reliability can be prevented.

A method of manufacturing a semiconductor device is described below. In the present embodiment, the above-described semiconductor wafer is used. For example, the redistribution layer 22 is formed as follows. A single layer or multilayer conductive film 24 is formed on the semiconductor wafer 10. For example, the conductive film 24 may be formed by a titanium tungsten (TiW) film and a copper (Cu) film formed on the TiW film. The conductive film 24 may be formed by sputtering. The conductive film 24 is formed at least in the region in which the redistribution layer 22 is formed. The conductive film 24 may be formed over the entire surface of the semiconductor wafer 10 on which the pad 18 is formed. A plating resist layer (not shown) is formed on the conductive film 24 so as to avoid the region in which the redistribution layer 22 is formed. The plating resist layer formed on the conductive film 24 may be patterned after performing a photolithographic step and the like. The redistribution layer 22 is formed on the conductive film 24 in the opening region of the plating resist layer by electroplating using the conductive film 24 as an electrode. The redistribution layer 22 may be formed by electroless plating.

At least two resin layers (first and second resin layers 30 and 28) are formed by forming the first resin layer 30 and the second resin layer 28 in that order. For example, the first resin layer 30 may be patterned by applying lithographic technology.

The second resin layer 28 may be formed by applying a resin using a printing method (screen printing method, for example). A resin before curing may be referred to as a resin precursor (this also applies to the other description). In the printing method, conventional steps may be used, including selectively printing a resin by using a squeezer and a mask and optionally performing post bake. The region in which the second resin layer 28 is formed is as described above. The second resin layer 28 may be formed by using the following method.

Figure 3:
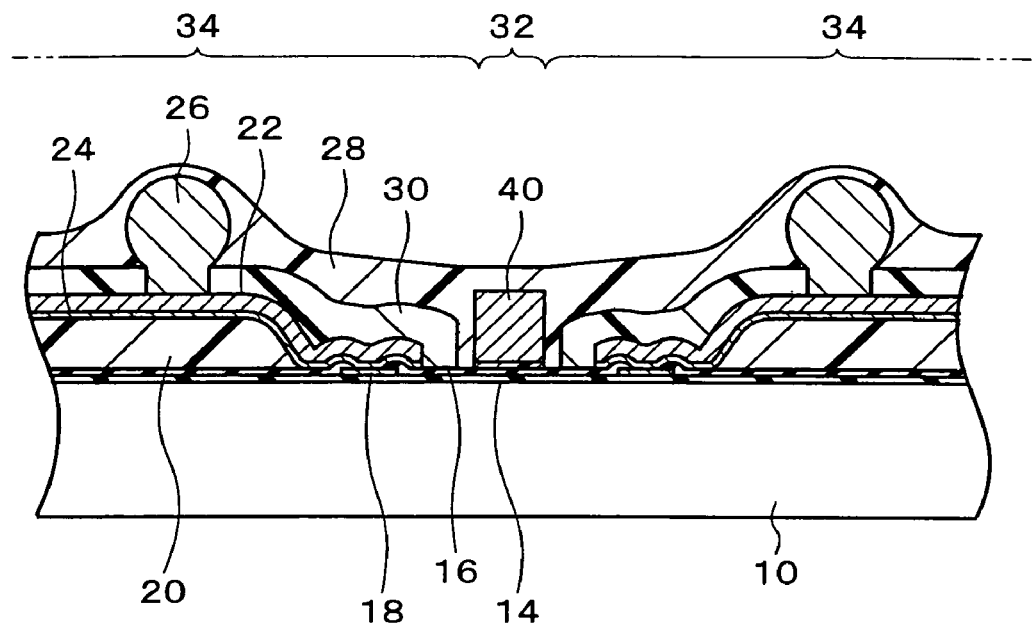
FIG. 3. is illustrative of a method of manufacturing a semiconductor device according to the first embodiment of the present invention.

FIG. 3 is illustrative of a method of forming the second resin layer 28. A non-resin layer 40 is formed on the semiconductor wafer 10, for example. The non-resin layer 40 is formed of a material other than a resin (metal such as copper, solder, or $SiO_2$, for example). The material for the non-resin layer 40 may have a spreading property lower than that of the material for the second resin layer 28. This ensures that a blade (see FIG. 7) for cutting the semiconductor wafer 10 rarely clogs. The material for the non-resin layer 40 may have an etching rate differing from that of the material for the second resin layer 28. In the case of removing the non-resin layer 40 by etching, the material for the non-resin layer 40 may have an etching rate higher than that of the material for the second resin layer 28. In this case, since the non-resin layer 40 can be easily removed from the semiconductor wafer 10, clogging of the blade for cutting the semiconductor wafer 10 rarely occurs. The non-resin layer 40 is formed in the first region 32. In the case of forming the insulating layer (stress relief layer) 20, the non-resin layer 40 may be formed to be higher than the insulating layer 20. The non-resin layer 40 is formed at an interval from the first resin layer 30 so as not to come in contact with the first resin layer 30.

The non-resin layer 40 may be formed by electroplating. For example, a plating resist layer (not shown) may be formed on the semiconductor wafer 10 so as to avoid the first region 32, and the non-resin layer 40 may be formed in the opening region of the plating resist layer, specifically, in the first region 32, by electroplating using the conductive film 24 before patterning as an electrode. The non-resin layer 40 may be formed by electroless plating. The non-resin layer 40 may be formed by ejecting droplets of a solvent containing fine particles of a conductive material (metal such as gold, silver, or copper, for example). For example, an ink-jet method or a Bubble Jet (registered trademark) method may be used. As a solvent containing fine particles of gold, "Perfect Gold" (manufactured by Vacuum Metallurgical Co., Ltd.) may be used. As a solvent containing fine particles of silver, "Perfect Silver" (manufactured by Vacuum Metallurgical Co., Ltd.) may be used. There are no specific limitations to the size of the fine particles. The fine particles used herein are particles which can be ejected together with a solvent.

In the case where the plating resist layer is formed, the plating resist layer is removed. In the case where the redistribution layer 22 is electrically connected with the non-resin layer 40 through the conductive film 24, the conductive film 24 is patterned. For example, the conductive film 24 may be etched by using the redistribution layer 22 and the non-resin layer 40 as a mask.

The second resin layer 28 is formed. The second resin layer 28 is formed in the second region 34 other than the first region (cutting region) 32. For example, the second resin layer 28 is formed to cover the non-resin layer 40. Specifically, the second resin layer 28 is also formed in the first region 32. However, the second resin layer 28 is formed on the non-resin layer 40 in the first region 32 due to the presence of the non-resin layer 40. The second resin layer 28 is formed to cover the external terminal 26. Since the external terminal 26 projects upward, the second resin layer 28 is thinner on the top of the external terminal 26.

At least a part of an area of the second resin layer 28 on the non-resin layer 40 is removed. The second resin layer 28 may be removed by dry etching using plasma or the like. This allows the second resin layer 28 to be formed in the second region 34 so as to avoid the first region 32. A part (end portion, for example) of the external terminal 26 is exposed by removing at least a part of an area of the second resin layer 28 on the external terminal 26. The area of the second resin layer 28 on the non-resin layer 40 and the area of the second resin layer 28 on the external terminal 26 may be removed at the same time.

The non-resin layer 40 may be removed. The non-resin layer 40 may be removed by wet etching. A solution containing ammonium persulfate or ferric chloride may be used for wet etching. The conductive film 24 formed under the non-resin layer 40 may be either removed or allowed to remain. This allows the non-resin layer 40 to be removed from the cutting (dicing) region. The second resin layer 28 has already been removed from the non-resin layer 40. The non-resin layer 40 need not be removed completely. A part or a residue of the non-resin layer 40 may remain if cutting (dicing) is not affected to a large extent.

Figure 4:
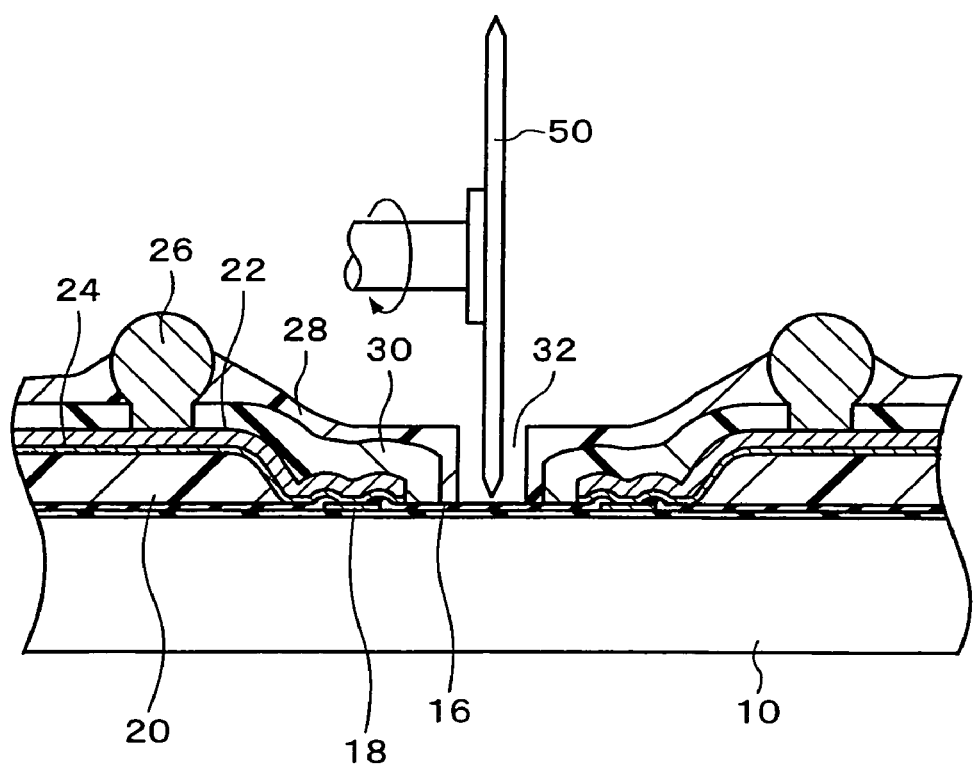
FIG. 4. is illustrative of a method of manufacturing a semiconductor device according to the first embodiment of the present invention.

As shown in FIG. 4, the semiconductor wafer 10 is cut (diced) in the first region 32. The semiconductor wafer 10 may be cut by using a blade 50. In this case, the semiconductor wafer 10 may be cut in a state in which a tape (not shown) or the like adheres to the semiconductor wafer 10.

According to the present embodiment, since the first and second resin layers 30 and 28 are not present in the first region (cutting region) 32, clogging of the blade 50 rarely occurs, whereby breakage of the edge of the semiconductor chip can be prevented. Therefore, a highly reliable semiconductor device can be manufactured.

Figure 5:
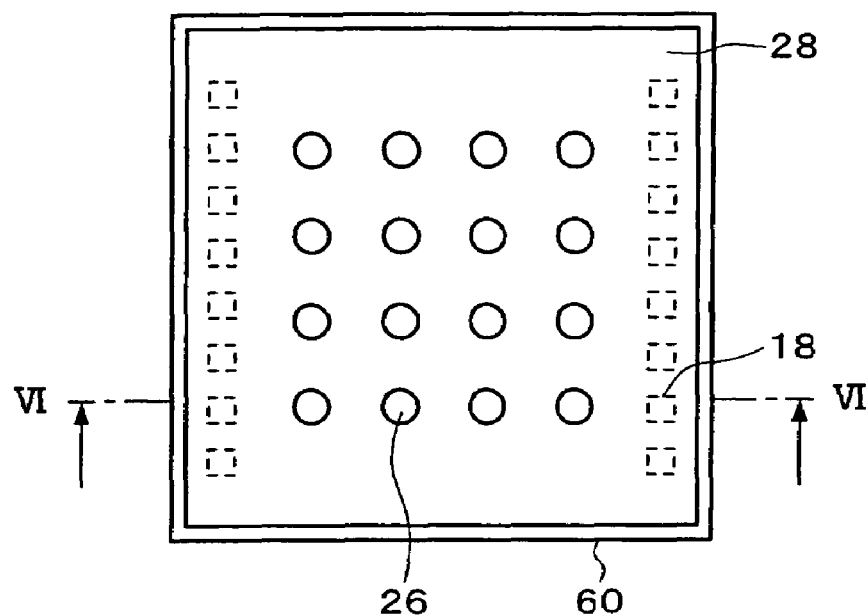
FIG. 5 shows a semiconductor device according to the first embodiment of the present invention.
Figure 6:
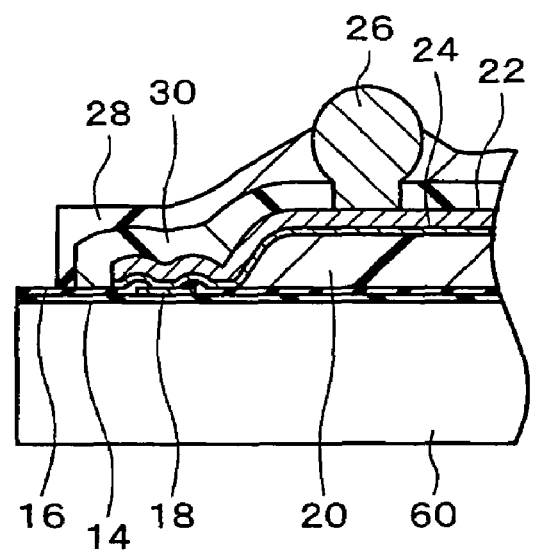
FIG. 6 is a partial cross-sectional view along the line VI-VI shown in FIG. 5.

FIG. 5 shows a semiconductor device manufactured by the above-described steps. FIG. 6 is a partial cross-sectional view along the line VI-VI shown in FIG. 5. The semiconductor device includes a semiconductor chip 60. The semiconductor chip 60 is obtained by dicing the semiconductor wafer 10. Elements formed by the above-described steps are formed on the semiconductor chip 60. The edge of the second resin layer 28 is located inside the edge of the semiconductor chip 60. The other details can be derived from the above description. Therefore, further description is omitted.

According to the present embodiment, since the second resin layer 28 among at least two resin layers (first and second resin layers 30 and 28) covers the side surface of the first resin layer 30, water does not enter between the first and second resin layers 30 and 28, whereby the first resin layer 30 is rarely separated. Therefore, a decrease in reliability can be prevented.

In the present embodiment, the second resin layer 28 is formed to avoid the first region 32 by forming the non-resin layer 40. However, the area of the second resin layer 28 in the first region 32 may be removed by etching without forming the non-resin layer 40.

Second Embodiment

Figure 7:
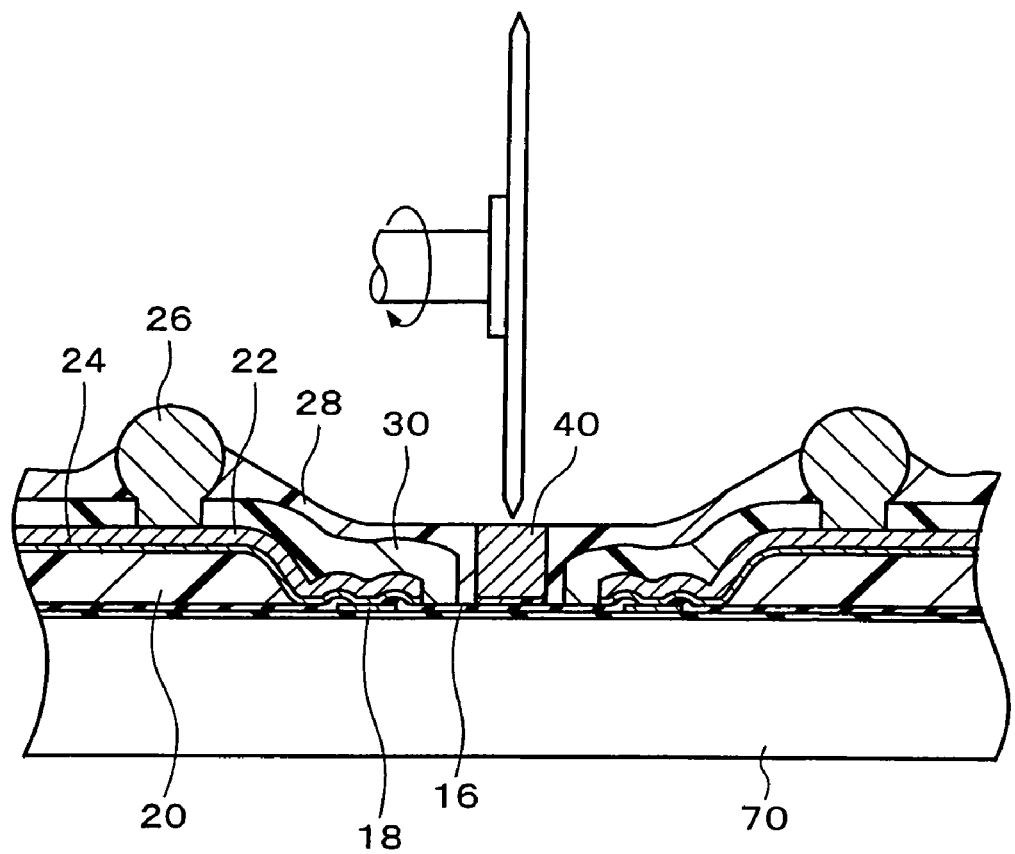
FIG. 7 shows a semiconductor wafer and a method of manufacturing a semiconductor device according to a second embodiment of the present invention.

FIG. 7 shows a semiconductor wafer according to a second embodiment of the present invention. In the present embodiment, a semiconductor wafer 70 includes the non-resin layer 40. In the first embodiment, the semiconductor device is manufactured by removing the non-resin layer 40. In the present embodiment, the semiconductor wafer 70 is cut while cutting the non-resin layer 40 without removing the non-resin layer 40. Since the non-resin layer 40 is formed of a material which rarely causes clogging of the blade 50 in comparison with a resin, the semiconductor wafer 70 can also be cut without causing occurrence of failure. The other details are the same as those described in the first embodiment.

Figure 8:
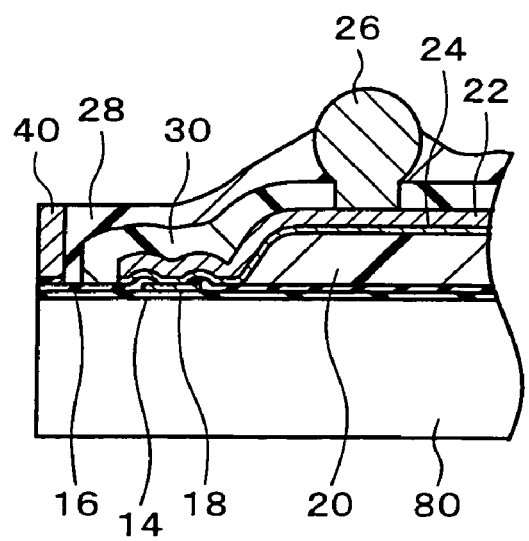
FIG. 8 shows a semiconductor device according to the second embodiment of the present invention.

In a semiconductor device manufactured by using the manufacturing method in the present embodiment, the non-resin layer 40 is formed on the edge of the semiconductor chip 80 as shown in FIG. 8. The second resin layer 28 is formed to be adjacent to the non-resin layer 40. If the non-resin layer 40 is a conductor, the non-resin layer 40 may be electrically connected with the outside. If the non-resin layer 40 is formed of a material having a high heat sink property such as a metal, the heat sink property of the semiconductor device can be increased. The other details are the same as those described in the first embodiment.

Third Embodiment

Figure 9:
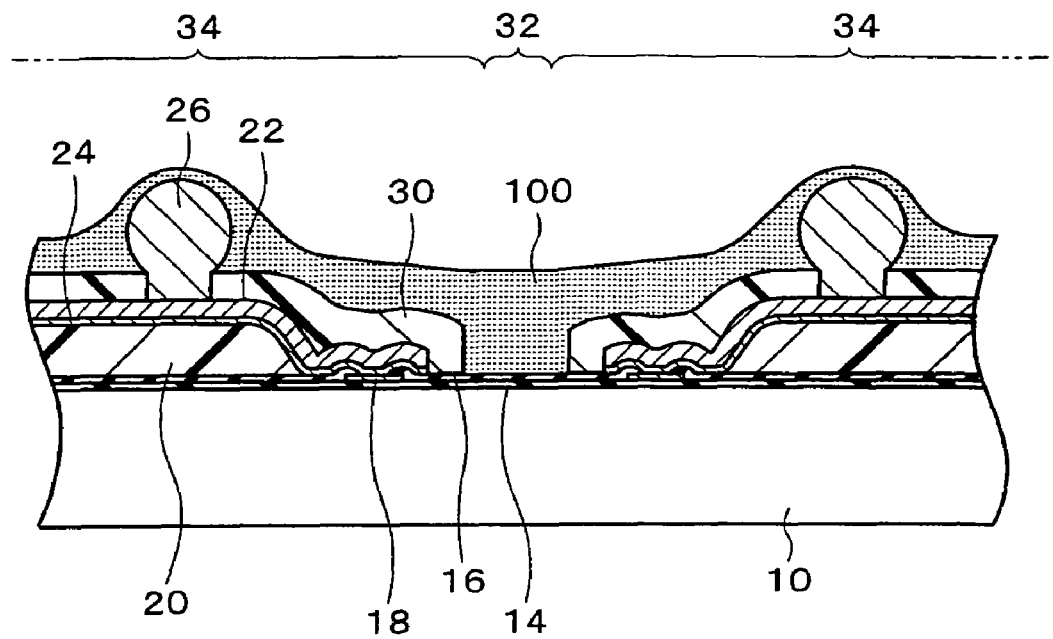
FIG. 9 is illustrative of a method of manufacturing a semiconductor device according to a third embodiment of the present invention.
Figure 10:
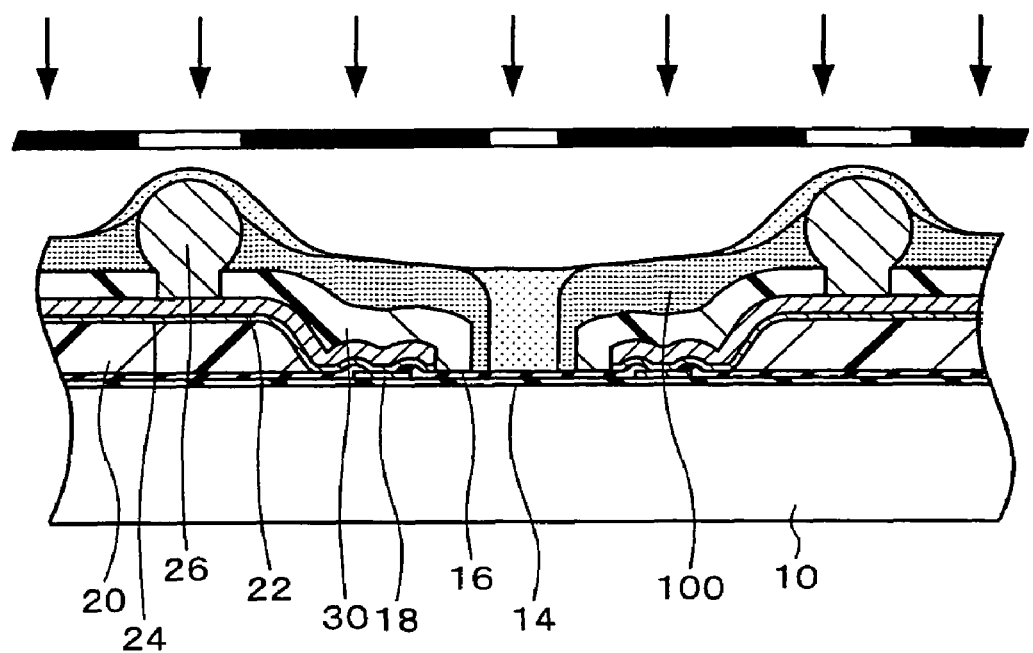
FIG. 10 is illustrative of a method of manufacturing a semiconductor device according to the third embodiment of the present invention.

FIGS. 9 and 10 are views illustrating a method of manufacturing a semiconductor device according to a third embodiment of the present invention. The present embodiment differs from the first embodiment as to the formation method of the second resin layer. The details described in the first embodiment can be applied to other details (process and configuration) of the present embodiment. The details of the present embodiment may be incorporated into the details described in the first embodiment.

As shown in FIG. 9, a sensitive resin (photosensitive resin, for example) 100 which is sensitive to radiation (light (visible light or ultraviolet ray) or an electron beam)) is provided by using a spin coating method or the like. The sensitive resin 100 is provided in the first and second regions 32 and 34 so as to cover the external terminals 26. Pre-baking is optionally performed.

As shown in FIG. 10, radiation (light, for example) is applied to the sensitive resin 100 through a mask. In more detail, the sensitive resin 100 is chemically changed so that the areas of the sensitive resin 100 in the first region 32 and on the external terminals 26 are readily removed in comparison with the other areas. The sensitive resin 100 is patterned by development. In more detail, the sensitive resin 100 is removed from the first region 32 and the top of the external terminals 26. In the case where the sensitive resin 100 is a thermosetting resin, post bake (cure) is performed. The second resin layer is thus formed by applying lithographic technology.

According to the present embodiment, the step of opening the second resin layer in the first region 32 and the step of opening the second resin layer on the external terminals 26 can be performed at the same time. Moreover, since the dry etching process is unnecessary, oxidation on the surface of the external terminal 26 does not proceed, whereby mounting failure can be prevented. According to the present embodiment, the quality of the semiconductor device can be stabilized.

Fourth Embodiment

Figure 11:
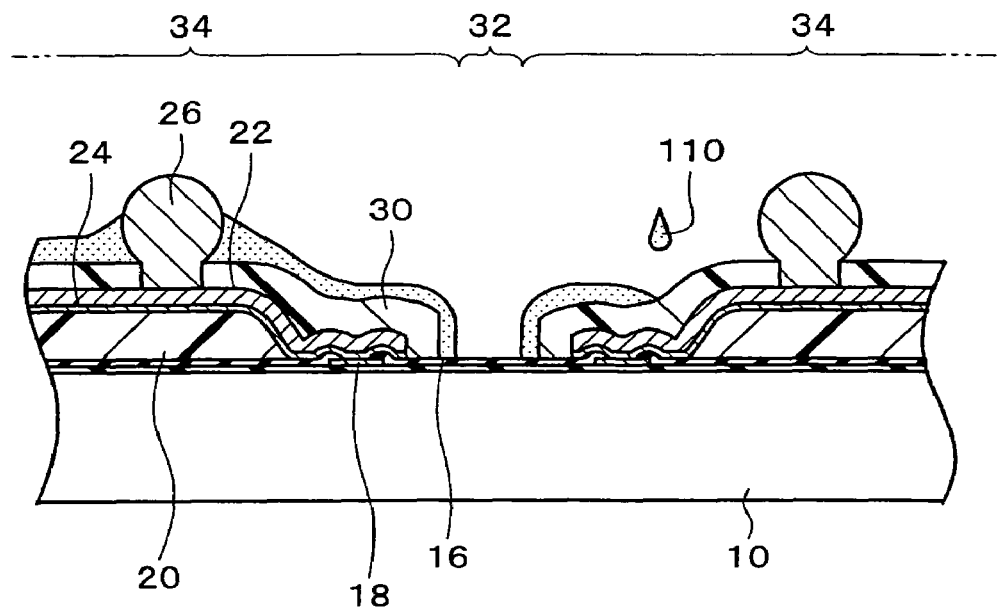
FIG. 11 is illustrative of a method of manufacturing a semiconductor device according to a fourth embodiment of the present invention.

FIG. 11 is illustrative of a method of manufacturing a semiconductor device according to a fourth embodiment of the present invention. In the present embodiment, the second resin layer is formed by ejecting a resin 110 by using an ink-jet method. According to the ink-jet method, the resin 110 can be provided to an arbitrary region. Moreover, a resin having no sensitivity to radiation can be used.

The details described in the first embodiment can be applied to other details (process and configuration) of the present embodiment. The details of the present embodiment may be incorporated into the details described in the first embodiment.

Fifth Embodiment

Figure 12:
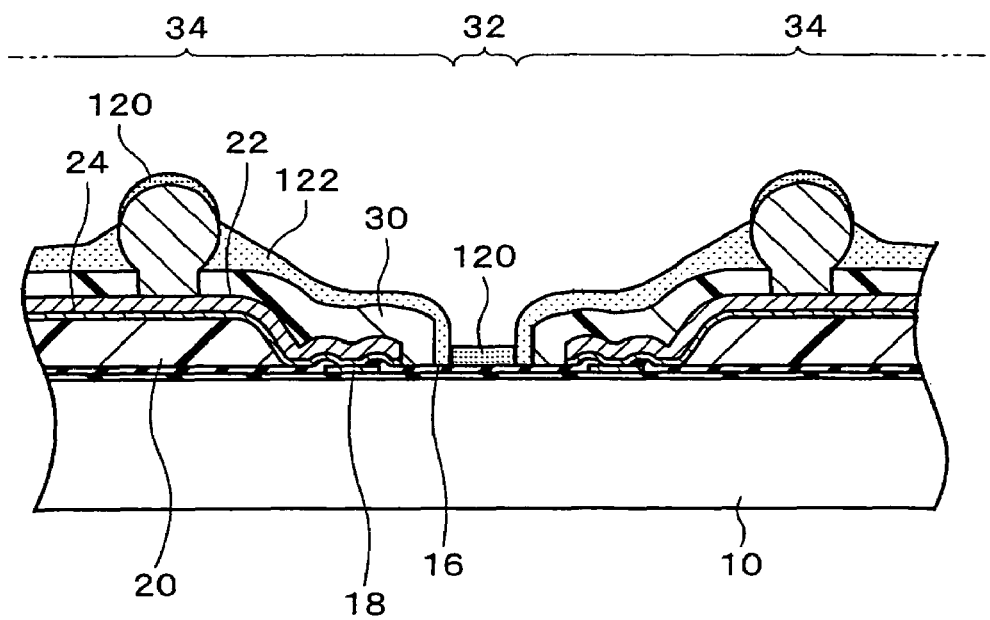
FIG. 12 is illustrative of a method of manufacturing a semiconductor device according to a fifth embodiment of the present invention.

FIG. 12 is illustrative of a method of manufacturing a semiconductor device according to a fifth embodiment of the present invention. In the present embodiment, a liquid repellent film 120 is formed. The liquid repellent film 120 repels a resin 122 for forming the second resin layer, and may be formed of a fluororesin or the like. The liquid repellent film 120 is formed in the first region 32 and on the external terminals 26. The liquid repellent film 120 may be formed by applying an ink-jet method or photolithography. The resin 122 is provided on the semiconductor wafer 10 by using a spin coating method or the like. The resin 122 need not have sensitivity to radiation.

As shown in FIG. 12, the resin 122 is repelled by the liquid repellent film 120 and remains so as to avoid the first region 32 and the external terminals 26. After optionally performing pre-baking, the liquid repellent film 120 may be removed by washing. Post-baking is then performed. The second resin layer is formed in this manner.

The details described in the first embodiment can be applied to other details (process and configuration) of the present embodiment. The details of the present embodiment may be incorporated into the details described in the first embodiment.

Figure 13:
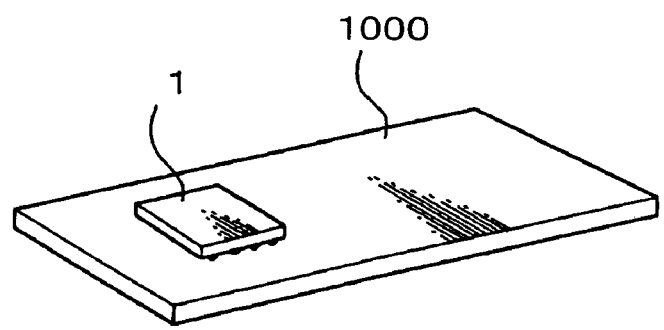
FIG. 13 shows a circuit board on which a semiconductor device according to an embodiment of the present invention is mounted.

FIG. 13 shows a circuit board 1000 on which a semiconductor device 1 according to the embodiment of the present invention is mounted. An organic substrate such as a glass epoxy substrate is generally used as the circuit board 1000. An interconnect pattern is formed of copper or the like on the circuit board 1000 so as to form a desired circuit. The interconnect pattern and the semiconductor device 1 are electrically connected by mechanically connecting the interconnect pattern with the external terminals 26 of the semiconductor device 1.

Figure 14:
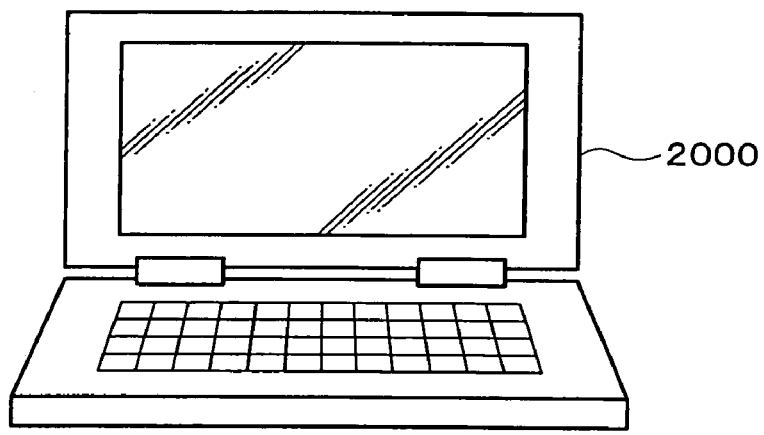
FIG. 14 shows electronic equipment including a semiconductor device according to an embodiment of the present invention.
Figure 15:
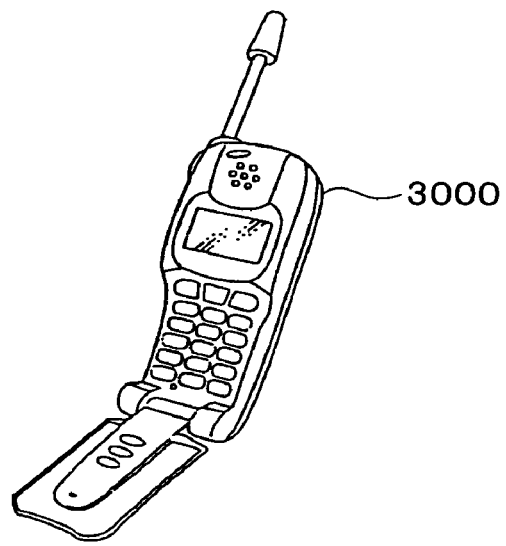
FIG. 15 shows another piece of electronic equipment including a semiconductor device according to an embodiment of the present invention.

FIGS. 14 and 15 respectively show a notebook-type personal computer 2000 and a portable telephone 3000 as examples of electronic equipment including the semiconductor device 1 to which the sent invention is applied.

What is claimed is:

1. A semiconductor wafer comprising:
   a semiconductor body which includes an integrated circuit, an interconnect which is electrically connected with the integrated circuit, and a pad which is an end portion of the interconnect and is formed on a surface of the semiconductor body;
   a wiring pattern which is formed over the semiconductor body, is electrically connected with the pad, and includes a first portion located over the pad and a second section other than the first portion;
   a first resin layer which is formed over the wiring pattern;
   a second resin layer which is formed over the first resin layer and in direct contact with the semiconductor body, the second resin layer covering a side surface of the first resin layer, the first and second resin layers having no wiring therebetween; and an external terminal which is formed over the second section of the wiring pattern and is electrically connected with the wiring pattern.

2. The semiconductor wafer as defined in claim 1,
wherein the first resin layer is formed to cover the wiring pattern excluding a region in which the external terminal is formed, and
wherein the second resin layer is formed to cover at least a lower part of the external terminal.

3. The semiconductor wafer as defined in claim 1, further comprising an insulating layer under the wiring pattern.

4. The semiconductor wafer as defined in claim 1,
wherein the semiconductor wafer includes a first region and a plurality of second regions, each of the second regions being surrounded by the first region, and
wherein the first resin layer and the second resin layer are formed only in the second region.

5. The semiconductor wafer as defined in claim 4,
wherein a part of the second resin layer which covers the side surface of the first resin layer is formed in a upper part and along an edge portion of the second region.

6. The semiconductor wafer as defined in claim 1, the second resin layer extending further along a surface of the semiconductor body than the first resin layer so as to cover a surface area of the semiconductor body that is not covered by the first resin layer.

7. A semiconductor device comprising:
a semiconductor body which includes an integrated circuit, an interconnect which is electrically connected with the integrated circuit, and a pad which is an end portion of the interconnect and is formed on a surface of the semiconductor body;
a wiring pattern which is formed over the semiconductor body, is electrically connected with the pad, and includes a first portion located over the pad and a second section other than the first portion;
a first resin layer which is formed over the wiring pattern;
a second resin layer which is formed over the first resin layer and in direct contact with the semiconductor body, the second resin layer covering a side surface of the first resin layer, the first and second resin layers having no wiring therebetween; and
an external terminal which is formed over the second section of the wiring pattern and is electrically connected with the wiring pattern.

8. The semiconductor device as defined in claim 7,
wherein the first resin layer is formed to cover the wiring pattern excluding a region in which the external terminal is formed, and
wherein the second resin layer is formed to cover at least a lower part of the external terminal.

9. The semiconductor device as defined in claim 7, further comprising an insulating layer under the wiring pattern.

10. The semiconductor device as defined in claim 7, the second resin layer extending further along a surface of the semiconductor body than the first resin layer so as to cover a surface area of the semiconductor body that is not covered by the first resin layer.

11. A circuit board on which the semiconductor device as defined in claim 7 is mounted.

12. Electronic equipment comprising the semiconductor device as defined in claim 7.

13. A semiconductor wafer comprising:
a semiconductor body with a passivation film formed thereon which includes an integrated circuit, an interconnect which is electrically connected with the integrated circuit, and a pad which is an end portion of the interconnect and is formed on a surface of the semiconductor body;
a wiring pattern which is formed over the semiconductor body, is electrically connected with the pad, and includes a first portion located over the pad and a second section other than the first portion;
a first resin layer which is formed over the wiring pattern;
a second resin layer which is formed over the first resin layer and in direct contact with the passivation film, the second resin layer covering a side surface of the first resin layer, the first and second resin layers having no wiring therebetween; and
an external terminal which is formed over the second section of the wiring pattern and is electrically connected with the wiring pattern.

14. A semiconductor device comprising:
a semiconductor body with a passivation film formed thereon which includes an integrated circuit, an interconnect which is electrically connected with the integrated circuit, and a pad which is an end portion of the interconnect and is formed on a surface of the semiconductor body;
a wiring pattern which is formed over the semiconductor body, is electrically connected with the pad, and includes a first portion located over the pad and a second section other than the first portion;
a first resin layer which is formed over the wiring pattern;
a second resin layer which is formed over the first resin layer and in direct contact with the passivation film, the second resin layer covering a side surface of the first resin layer, the first and second resin layers having no wiring therebetween; and
an external terminal which is formed over the second section of the wiring pattern and is electrically connected with the wiring pattern.

* * * * *